(12) United States Patent
Lin

(10) Patent No.: US 10,686,429 B1
(45) Date of Patent: Jun. 16, 2020

(54) HIGH-SPEED CLOCK FILTER AND METHOD THEREOF

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 16/748,883

(22) Filed: Jan. 22, 2020

(51) Int. Cl.
*H03K 3/03* (2006.01)

(52) U.S. Cl.
CPC .................. *H03K 3/0315* (2013.01)

(58) Field of Classification Search
None
See application file for complete search history.

(56) References Cited

U.S. PATENT DOCUMENTS

| | | | | |
|---|---|---|---|---|
| 5,952,892 A | * | 9/1999 | Szajda | H03K 3/0231 327/157 |
| 2002/0186072 A1 | * | 12/2002 | Mano | H03K 3/0315 327/538 |
| 2008/0238556 A1 | * | 10/2008 | Isik | H03K 3/0315 331/57 |
| 2008/0252387 A1 | * | 10/2008 | Higashi | H03L 7/099 331/57 |
| 2015/0145608 A1 | * | 5/2015 | Katyal | H03K 3/0315 331/57 |
| 2017/0093418 A1 | * | 3/2017 | Baek | H03M 1/124 |

* cited by examiner

*Primary Examiner* — Cassandra F Cox
(74) *Attorney, Agent, or Firm* — McClure, Qualey & Rodack, LLP

(57) ABSTRACT

A clock filter includes a ring oscillator comprising a plurality of inverters cascaded in a ring topology and configured to output a plurality of internal voltages including a first internal voltage and a second internal voltage. The clock filter further includes a coupling circuit configured to couple an input voltage to the first internal voltage, a sampling circuit configured to output a control voltage by sampling the second internal voltage in accordance with the input voltage, and a current source configured to output the bias current in accordance with the control voltage.

20 Claims, 2 Drawing Sheets

US 10,686,429 B1

HIGH-SPEED CLOCK FILTER AND METHOD THEREOF

BACKGROUND OF THE DISCLOSURE

Field of the Disclosure

The present disclosure generally relates to clock filters, and more particularly to clock filters for high-speed applications.

Description of Related Art

As is known, a clock signal is a voltage signal cyclically toggling between a low level and a high level. A frequency of a clock quantifies how frequently the toggling occurs. A frequency spectrum of a clock comprises a fundamental spectral component of a fundamental frequency and a plurality of harmonics. On many occasions, the spectrum may further comprise other spectral components, which are referred to as spurious tones. Spurious tones are generally undesirable. A clock filter is a circuit configured to alleviate spurious tones of a clock. A prior art clock filter is based on using a band-pass filter tuned to the fundamental frequency. For a high-speed clock of a multi-giga-Hertz fundamental frequency, a band-pass filter requires a resonant tank that is usually embodied by a LC (which stands for inductor-capacitor) network. As is known, an inductor is a relatively expensive circuit component.

What is desired is a clock filter suitable for high-speed application without the need of an inductor.

BRIEF DESCRIPTION OF THIS DISCLOSURE

In an embodiment, a clock filter comprises: a ring oscillator comprising a plurality of inverters cascaded in a ring topology and configured to output a plurality of internal voltages including a first internal voltage and a second internal voltage; a coupling circuit configured to couple an input voltage to the first internal voltage; a sampling circuit configured to output a control voltage by sampling the second internal voltage in accordance with the input voltage; and a current source configured to output a bias current in accordance with the control voltage.

In an embodiment, a method comprises: incorporating a ring oscillator comprising a plurality of inverters cascaded in a ring topology configured to output a plurality of internal voltages including a first internal voltage and a second internal voltage in accordance with a bias current; coupling an input voltage to the first internal voltage using a coupling circuit; establishing a control voltage by sampling the second internal voltage in accordance with the input voltage; and incorporating a current source to output the bias current in accordance with the control voltage.

DETAILED DESCRIPTION OF THIS DISCLOSURE

The present disclosure is directed to clock filters. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "voltage," "current," "power," "CMOS (complementary metal oxide semiconductor)," "NMOS (n-channel metal oxide semiconductor)," "PMOS (p-channel metal oxide semiconductor)," "inductor," "capacitor," "band-pass filter," "spectrum," "frequency," "harmonics," " " oscillator," "ring oscillator," "inverter," "buffer," "coupling," "AC (alternate current) coupling," "DC (direct-current) coupling," "low-pass filter," "switch," and "negative feedback." Terms like these are used in a context of microelectronics, and the associated concepts are apparent to those of ordinary skills in the art and thus will not be explained in detail here.

Persons of ordinary skill in the art can recognize a capacitor symbol and a ground symbol, can recognize a MOS (metal-oxide semiconductor) transistor symbol, for both PMOS transistor and NMOS transistor, and identify the "source," the "gate," and the "drain" terminals thereof. Those of ordinary skills in the art can read schematics of a circuit comprising capacitors, NMOS transistors, and PMOS transistors, and do not need a verbose description about how one transistor connects with another in the schematics. Persons of ordinary skills in the art also understand units such as GHz (giga-Hertz), micron (• m), nanometer (nm), and femto-Farad (fF).

Throughout this disclosure, a "signal" is either a voltage or a current carrying a certain information.

This present disclosure is disclosed from an engineering perspective. For instance, "X is equal to Y" means "a difference between X and Y is smaller than a specified engineering tolerance"; "X is much smaller than Y" means "X divided by Y is smaller than an engineering tolerance"; and "X is zero" means "X is smaller than a specified engineering tolerance."

Throughout this disclosure, "$V_{DD}$" denotes a power supply node.

Figure 1:
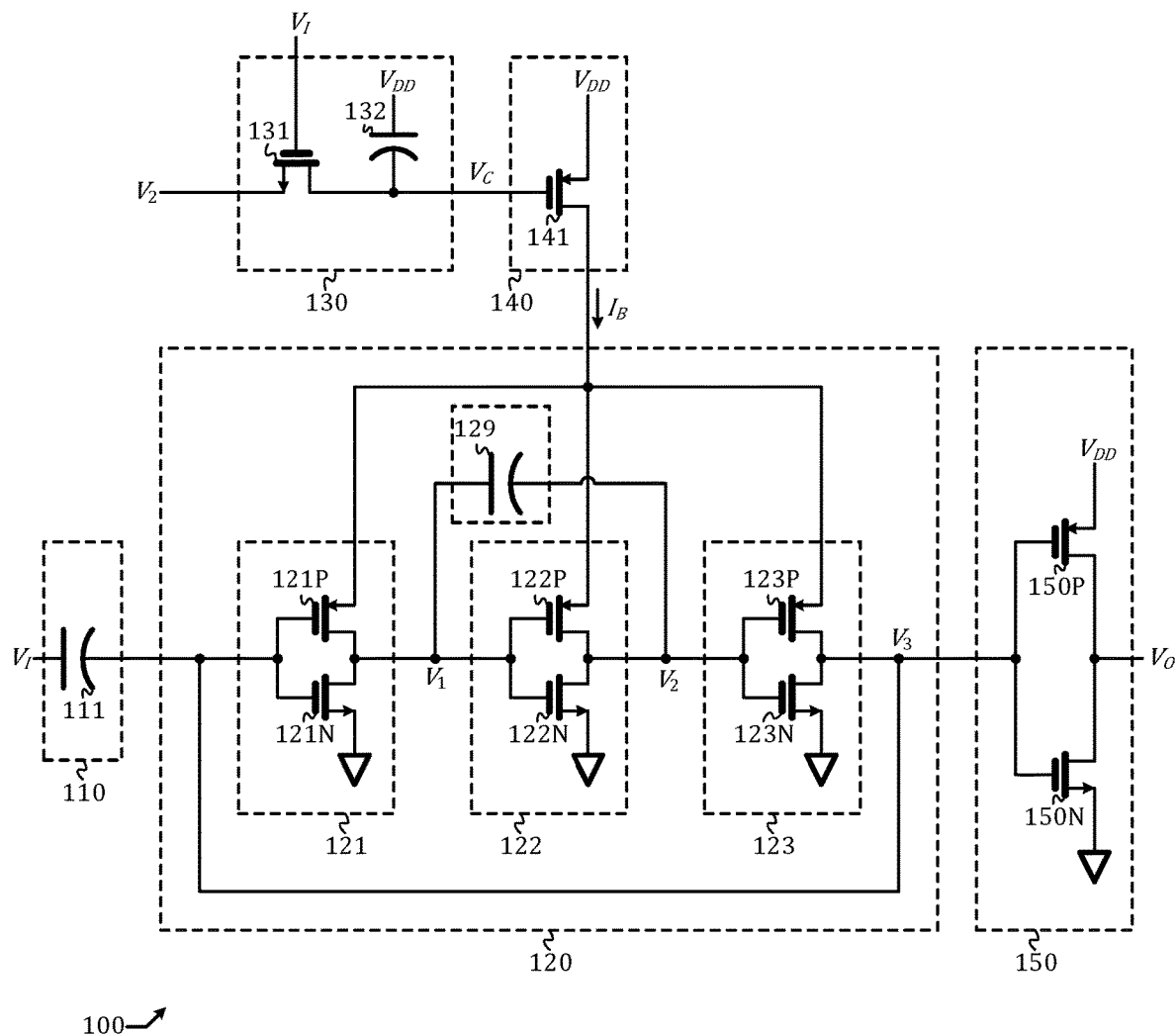
FIG. 1 shows a schematic diagram of a clock filter in accordance with an embodiment of the present disclosure.

A schematic diagram of a clock filter 100 in accordance with an embodiment of the present disclosure is shown in FIG. 1. Clock filter 100 comprises: a ring oscillator 120 comprising a plurality of inverters cascaded in a ring topology configured to output a plurality of internal voltages in accordance with a bias current $I_B$ (by way of example but not limitation, three inverters 121, 122, and 123 outputting three internal voltages $V_1$, $V_2$, and $V_3$, respectively, are shown); a coupling circuit 110 configured to couple an input voltage $V_I$ to a first internal voltages (by way of example, $V_3$) of the ring oscillator 120; a sampling circuit 130 configured to output a control voltage $V_C$ by sampling a second internal voltage (by way of example, $V_2$) of the ring oscillator 120 in accordance with the input voltage $V_I$; and a current source 140 configured to output a bias current $I_B$ in accordance with the control voltage $V_C$. The input voltage $V_I$ is a clock that has a fundamental spectral component of a fundamental frequency along with harmonics but may also contain a spurious tone that is unwanted. The ring oscillator 120 is configured to embody a clock filtering function so that an internal voltage (i.e. $V_1$, $V_2$, or $V_3$) is a clock that has a fundamental spectral component of the same fundamental frequency (as that in the input voltage $V_I$) but contains a much weaker spurious tone.

Ring oscillators in general and an embodiment such as ring oscillator 120 (excluding the Miller capacitor 129, which will be explained later in this disclosure) are well known in the prior art and thus not described in detail herein. Being an oscillator, ring oscillator 120 has an oscillatory behavior with an inherent oscillation frequency that depends on the bias current $I_B$: a larger (smaller) bias current $I_B$ leads to a higher (lower) inherent oscillation frequency. The bias current $I_B$ is adjusted in a closed-loop manner so that the inherent oscillation frequency is equal to the fundamental frequency of the input voltage $V_I$; consequently, to the fundamental spectral component of the input voltage $V_I$, the coupling to the ring oscillator 120 is synchronous to the inherent oscillation of the ring oscillator 120; therefore, the fundamental spectral component can couple to the ring oscillator 120 efficiently and remain strong in the internal voltages (i.e. $V_1$, $V_2$, and $V_3$). To the spurious tone in the input voltage $V_I$, on the other hand, the coupling to the ring oscillator 120 is asynchronous to the inherent oscillation of the ring oscillator 120; therefore, the spurious tone cannot couple to the ring oscillator 120 efficiently and thus will diminish in the internal voltages ($V_1$, $V_2$, and $V_3$). The clock filtering function is thus fulfilled.

The sampling circuit 130 comprises a NMOS transistor 131, which embodies a switch, and a shunt capacitor 132, which embodies a low-pass filter. The current source 140 comprises a PMOS transistor 141; when the control voltage $V_C$ rises (falls), $I_B$ decreases (increases). When the inherent oscillation frequency of the ring oscillator 120 is too high (low) and consequently a timing of $V_2$ is too early (late), too much (little) of a pulse of $V_2$ is sampled by the sampling circuit 130 and as a result the control voltage $V_C$ will rise (fall) and cause the bias current $I_B$ to decrease (increase) and consequently lower (raise) the inherent oscillation frequency of the ring oscillator 120. A negative feedback mechanism is thus established and adjusting the bias current $I_B$ in a closed loop manner to make the inherent oscillation frequency of the ring oscillator 120 equal to the fundamental frequency of the input voltage $V_I$.

In an embodiment, the clock filter 100 further comprises an inverter 150 configured to receive $V_3$ and output an output voltage $V_O$. Inverter 150 functions as an output buffer. In another embodiment not shown in figure, inverter 150 receives $V_1$ instead of $V_3$. In yet another embodiment not shown in figure, inverter 150 receives $V_2$ instead of $V_3$. Generally, inverter 150 receives one of the internal voltages of the ring oscillator 120 and output the output voltage $V_O$.

Inverter 121 (122, 123, 150) comprises NMOS transistor 121N (122N, 123N, 150N) and PMOS transistor 121P (122P, 123P, 150P). Inverters are well understood by those of ordinary skill in the art and thus explained in detail.

In the embodiment shown in FIG. 1, the coupling circuit 110 comprises a capacitor 111; this is an embodiment of AC (alternate-current) coupling. In an alternative embodiment not shown in figure but clear to those of ordinary skill in the art, the capacitor 111 is replaced with a resistor; this is an embodiment of DC (direct-current) coupling.

In an embodiment useful in a case where a feasible inherent oscillation frequency of the ring oscillator 120 is higher than the fundamental frequency of the input voltage $V_I$, a Miller capacitor 129 configured to couple the input ($V_1$) and the output ($V_2$) of inverter 122 is inserted. The concept of "Miller capacitor" is well known to those of ordinary skill in the art and thus explained in detail here.

Miller capacitor 129 is used to allow the ring oscillator 120 to have a sufficiently low inherent oscillation frequency.

By way of example but not limitation, in an embodiment: clock filter 100 is a monolithic integrated circuit fabricated on a silicon substrate using a 28 nm CMOS process; a fundamental frequency of the input voltage $V_I$ is 3.2 GHz; $V_{DD}$ is 1.05V; capacitor 111 is 12fF; width/length of NMOS transistor 121N is 1 μm/150 nm; width/length of PMOS transistor 121P is 1.3 μm/150 nm; width/length of NMOS transistor 122N is 1 μm/60 nm; width/length of PMOS transistor 122P is 1.3 μm/60 nm; width/length of NMOS transistor 123N is 1 μm/60 nm; width/length of PMOS transistor 123P is 1.3 μm/60 nm; width/length of NMOS transistor 150N is 1 μm/30 nm; width/length of PMOS transistor 150P is 1.3 μm/30 nm; width/length of NMOS transistor 131 is 1 μm/30 nm; Miller capacitor 120 is 12fF; capacitor 132 is 500fF; and width/length of PMOS transistor 141 is 64 μm/30 nm.

Figure 2:
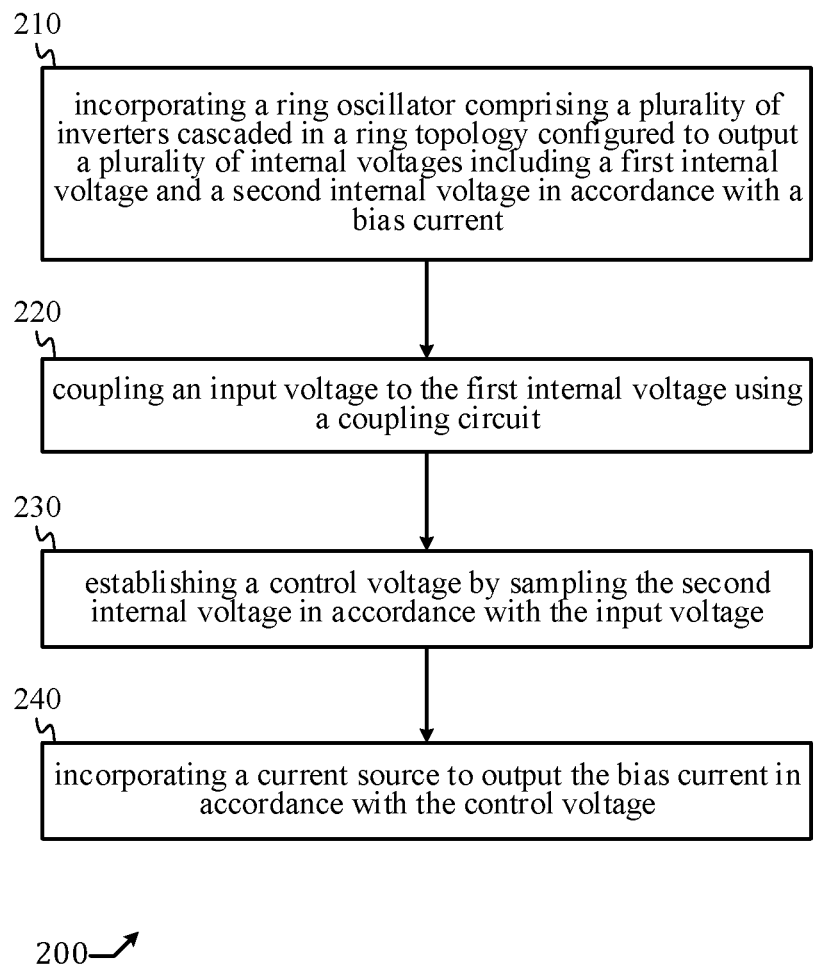
FIG. 2 shows a flow diagram of a method in accordance with an embodiment of the present disclosure.

As illustrated by a flow diagram 200 shown in FIG. 2, a method in accordance with an embodiment of the present disclosure comprises the following steps: (step 210) incorporating a ring oscillator comprising a plurality of inverters cascaded in a ring topology configured to output a plurality of internal voltages including a first internal voltage and a second internal voltage in accordance with a bias current; (step 220) coupling an input voltage to the first internal voltage using a coupling circuit; (step 230) establishing a control voltage by sampling the second internal voltage in accordance with the input voltage; and (step 240) incorporating a current source to output the bias current in accordance with the control voltage.

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. A clock filter comprising:
   a ring oscillator comprising a plurality of inverters cascaded in a ring topology and configured to output a plurality of internal voltages including a first internal voltage and a second internal voltage;
   a coupling circuit configured to couple an input voltage to the first internal voltage;
   a sampling circuit configured to output a control voltage by sampling the second internal voltage in accordance with the input voltage; and
   a current source configured to output a bias current in accordance with the control voltage.

2. The clock filter of claim 1, wherein the sampling circuit comprises a switch and a capacitor.

3. The clock filter of claim 2, wherein the switch is controlled by the input voltage and configured to sample the second internal voltage to the capacitor in accordance with the input voltage.

4. The clock filter of claim 3, wherein the control voltage is a voltage at the capacitor.

5. The clock filter of claim 1, wherein the coupling circuit comprises a capacitor.

6. The clock filter of claim 1, wherein the coupling circuit comprises a resistor.

7. The clock filter of claim 1, wherein the ring oscillator comprises a Miller capacitor inserted between an input and an output of an inverter among said plurality of inverters.

8. The clock filter of claim 1 further comprising an output buffer.

9. The clock filter of claim 8, wherein the output buffer comprises an inverter configured to receive one of said plurality of internal voltages and output an output voltage.

10. The clock filter of claim 1, wherein the current source comprises a PMOS (p-channel metal oxide semiconductor) transistor.

11. A method comprising:
incorporating a ring oscillator comprising a plurality of inverters cascaded in a ring topology configured to output a plurality of internal voltages including a first internal voltage and a second internal voltage in accordance with a bias current;
coupling an input voltage to the first internal voltage using a coupling circuit;
establishing a control voltage by sampling the second internal voltage in accordance with the input voltage; and
incorporating a current source to output the bias current in accordance with the control voltage.

12. The method of claim 11, wherein sampling the second internal voltage in accordance with the input voltage comprises using a switch and a capacitor.

13. The method of claim 12, wherein the switch is controlled by the input voltage and configured to sample the second internal voltage to the capacitor in accordance with the input voltage.

14. The method of claim 13, wherein the control voltage is a voltage at the capacitor.

15. The method of claim 11, wherein the coupling circuit comprises a capacitor.

16. The method of claim 11, wherein the coupling circuit comprises a resistor.

17. The method of claim 11, wherein the ring oscillator comprises a Miller capacitor inserted between an input and an output of an inverter among said plurality of inverters.

18. The method of claim 11 further comprising incorporating an output buffer.

19. The method of claim 18, wherein the output buffer comprises an inverter configured to receive one of said plurality of internal voltages and output an output voltage.

20. The method of claim 11, wherein the current source comprises a PMOS (p-channel metal oxide semiconductor) transistor.

* * * * *